US008563918B2

(12) United States Patent
McColloch

(10) Patent No.: US 8,563,918 B2
(45) Date of Patent: Oct. 22, 2013

(54) LASER HAMMERING TECHNIQUE FOR ALIGNING MEMBERS OF A CONSTRUCTED ARRAY OF OPTOELECTRONIC DEVICES

(75) Inventor: Laurence R. McColloch, Santa Clara, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 285 days.

(21) Appl. No.: 12/985,776

(22) Filed: Jan. 6, 2011

(65) Prior Publication Data

US 2012/0177079 A1 Jul. 12, 2012

(51) Int. Cl.
*H01J 5/02* (2006.01)

(52) U.S. Cl.
USPC .......................................... 250/239; 250/548

(58) Field of Classification Search
USPC ................ 250/239, 216, 548; 385/14, 52–60, 385/65–69; 438/106, 637–640, 667–671; 257/698, 774, 621–623
See application file for complete search history.

(56) References Cited

U.S. PATENT DOCUMENTS

| 6,974,168 | B2 | 12/2005 | Capewell |
| 7,116,694 | B2 | 10/2006 | Peters et al. |
| 8,203,207 | B2 * | 6/2012 | Getz et al. ..................... 257/698 |
| 2004/0241892 | A1 | 12/2004 | Colgan et al. |

OTHER PUBLICATIONS

Conk, Ryan D., Fabrication Techniques for Micro-Optical Device Arrays, Mar. 2002, pp. 1-95, Air Force Institute of Technology, Wright-Patterson Air Force Base, Ohio available for download at https://www.afresearch/org/skins/rims/q__mod__be0e99f3-fc56-4ccb-8dfe-670c0822a153/q_act_downloadpaper/q_obj__201ae629-906c-4533-b42f-0376a5b56cd1/display.aspx?re=enginespage.
Kang,Sueng-Goo, et al., Fabrication of Semiconductor Optical Switch Module User Laser Welding Technique, I.E.E.E. Transactions on Advanced Packaging, Nov. 2000, pp. 672-680, vol. 23, Issue 4.

* cited by examiner

*Primary Examiner* — Que T Le

(57) ABSTRACT

A parallel transceiver includes a constructed array of dice. The constructed array comprises an integer number of dies that each have an integer number of optoelectronic devices arranged on the die. Each die forming the constructed array is attached to a respective tab of a shim that is fixed to a first lead frame. Each tab includes a bridge region and a mounting region. Each die is attached to a respective mounting region of a corresponding tab. When necessary, a laser hammering technique is performed whereby laser generated energy is applied along an axis in the bridge region of the shim to adjust the position of the optoelectronic devices on the die attached to the tab in one or more directions relative to the axis.

20 Claims, 12 Drawing Sheets

LEGEND

▨ HARVESTED 12 UNIT OPTICAL ARRAY

☒ INOPERABLE OPTICAL DEVICE

▨ DISCARDED OPERABLE OPTICAL DEVICE

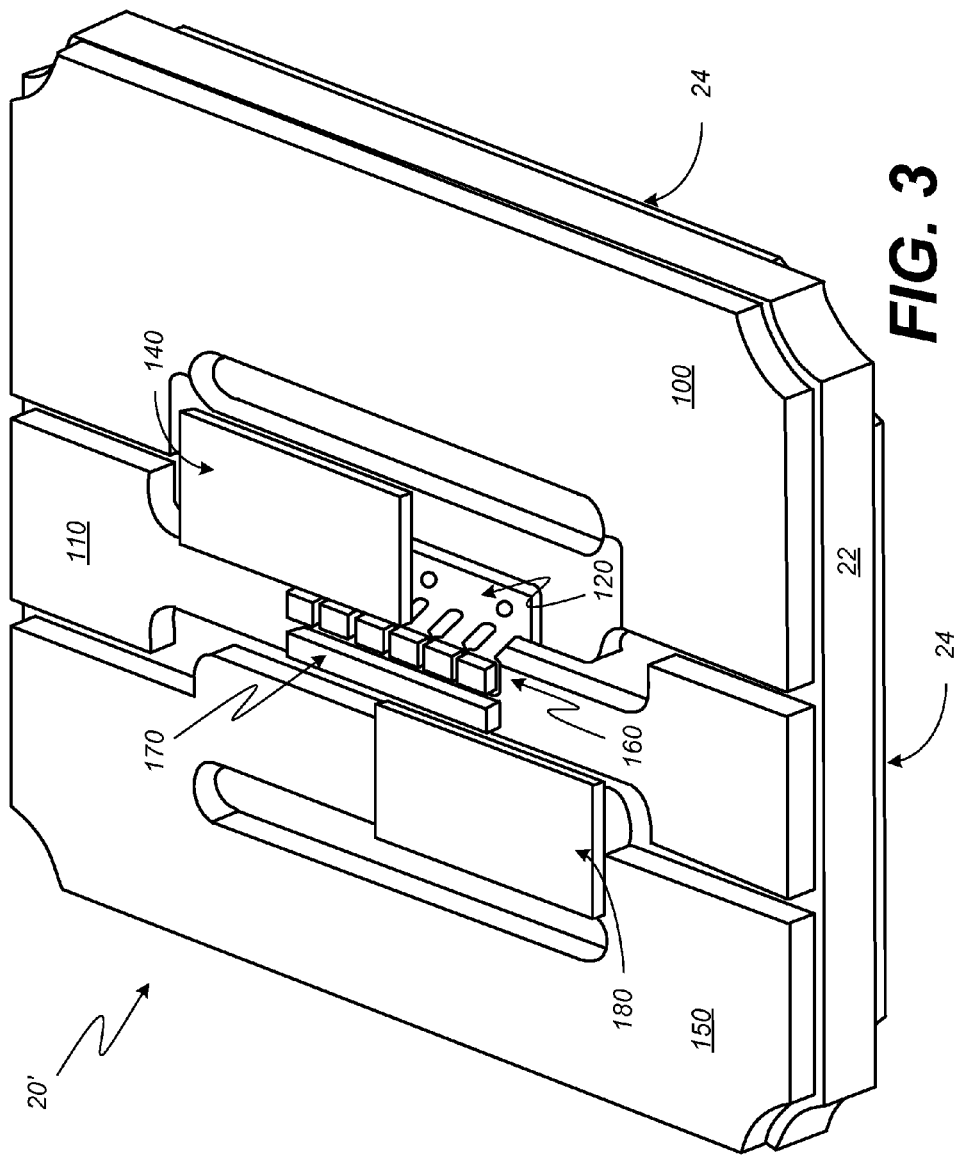

LASER HAMMERING TECHNIQUE FOR ALIGNING MEMBERS OF A CONSTRUCTED ARRAY OF OPTOELECTRONIC DEVICES

BACKGROUND

The present invention relates generally to optoelectronic communication systems and, more particularly, to an integrated optoelectronic module for parallel optical communication links.

There are many well-recognized benefits of using optical communication links to replace copper wiring in high data rate electronic systems such as computer systems, switching systems, and networking systems. Such potential benefits include increasing bandwidth and data rate, avoiding electromagnetic interference, limiting radiated electromagnetic noise from the system, reducing latency by placing optical/electrical (OLE) conversion as close as possible to the signal originating circuits (e.g., computer processors), increasing package density at lower cost per pin, among others.

At present, conventionally fabricated optoelectronic transducers typically include light emitting devices such as a Vertical Cavity Surface Emitting Laser (VCSEL) configured in a laser array, as well as light detecting devices such as photodiodes configured in a photodiode (PD) array. These optoelectronic transducers will often include an array of devices precisely arranged as a result of the scale and accuracy of photolithographic processes used to produce the individual semiconductors. That is, a series of VCSELS formed on a single wafer are cut or separated such that the array includes a desired number of optical emitters. These optoelectronic transducers include optical elements that are precisely arranged with the individual semiconductors to transmit and receive light.

Manufacturing lines for integrated circuits are inherently imperfect and invariably introduce defects into devices constructed on a wafer of semiconductor material. FIG. 1 illustrates a yield problem that results from six inoperable optical devices on a wafer 10 when it is desired to produce a 12-unit array. Each square on the surface 14 of the wafer 10 represents an instance of a semiconductor-based optical device. Devices marked with an "X" have a defect that renders the semiconductor device inoperable for its intended purpose. As a result of the defects, the desired number of elements in the array, and the fact that the wafer dicing process is performed by a rotating blade attached to a linearly translating carrier, only a limited number of such arrays can be produced from a single wafer.

In the example, devices marked in grayscale are individual members of a 12-device optical array that can be diced or separated from the wafer 10. Devices marked with a cross-hatch pattern are operable semiconductor devices that are discarded because they are not a member of a string of 12 contiguous semiconductor devices. FIG. 1 reveals that for the example wafer 10, relative device size, error rate and location, an error rate of less than 2% (or 6 inoperable devices out of 336 total devices on the wafer) results in a yield of 13 arrays (156 devices out of 336) for a yield rate of only 46.4%. Stated another way, about 51.8% of the operable devices on the wafer 10 are discarded (174 devices out of 336 total devices) because they are not in a row of 12 contiguous operable devices.

A need exists for an optoelectronic module that can be manufactured at relatively low costs with optical devices arranged in precise alignment with each other.

SUMMARY

An embodiment of a method for adjusting the relative position of a die in a constructed array of dice includes the steps of providing a shim having a first mounting region and N tabs extending from the first mounting region, the N tabs including a bridge region and a second mounting region, the second mounting region having a first surface and an opposed second surface, fixedly attaching a die having an integer number of optoelectronic devices on the first surface of the shim, adjusting the location of the second mounting region and the die by: applying laser generated energy to opposed surfaces of the shim along an axis within the bridge region until the shim material along the axis becomes liquid and thereafter removing the laser generated energy from the opposed surfaces allowing the material along the axis to solidify, thereby moving the second mounting region and the attached die in a direction substantially orthogonal to the axis.

A method for manufacturing a constructed array of optoelectronic devices includes the steps of separating N dies with M operational optoelectronic devices on each die from a semiconductor wafer, where N and M are integers, providing a first lead frame having an edge and a surface with a recess therein, fixedly attaching a shim at a first mounting region of the shim in the recess of the first lead frame, the shim having N tabs extending from the first mounting region beyond the edge of the first lead frame, the N tabs including a bridge region and a second mounting region, the second mounting region having a first surface for die attaching one of the N dies and an opposed second surface, checking the alignment of a respective feature of each of the N dies attached to the shim, when necessary, adjusting the relative alignment of at least one of the N dies by laser hammering the shim in the respective bridge region, repeating the checking and adjusting across the N dies until a desired alignment tolerance is achieved and fixedly attaching a second lead frame in registration with the first lead frame along the second surface.

An embodiment of an optoelectronic module having a constructed array of N dies with M operational optoelectronic devices on the N dies, where N and M are integers includes first and second lead frames and a shim. The first lead frame and the second lead frame have respective edges. The edges of the respective lead frames are adjacent to each other and form a channel. The channel permits the application of laser generated energy from laser sources in the vicinity of the channel on the shim. The shim has a first mounting region and N tabs that each include a bridge region and a second mounting region. The shim is attached to the first lead frame at the first mounting region. The N tabs extend from the first mounting region beyond the edge of the first lead frame. The bridge traverses the channel. The second mounting region includes a first surface for fixedly attaching an optoelectronic device and a second surface. The constructed array is aligned by laser hammering the shim in the bridge region.

The figures and detailed description that follow are not exhaustive. The disclosed embodiments are illustrated and described to enable one of ordinary skill to make and use the optical modules. Other embodiments, features and advantages of the optical modules and methods for manufacturing the same will be or will become apparent to those skilled in the art upon examination of the following figures and detailed description. All such additional embodiments, features and advantages are within the scope of the systems and methods as defined in the accompanying claims.

BRIEF DESCRIPTION OF THE FIGURES

An optoelectronic module and a method for manufacturing an aligned array of optical devices can be better understood with reference to the following figures. The components within the figures are not necessarily to scale, emphasis instead being placed upon clearly illustrating a shim that can be manipulated or rearranged dimensionally using a laser hammering technique to adjust the location of a die attached to the shim along two directions. Moreover, in the figures, like reference numerals designate corresponding parts throughout the different views.

FIG. 3 is a perspective view of the optoelectronic assembly of FIG. 2 with the frame and an optical sub-assembly removed.

DETAILED DESCRIPTION

A constructed array of optoelectronic devices includes a select number of separate dies arranged in accordance with a desired alignment tolerance to ensure satisfactory optical coupling with an optical sub-assembly. By using single optoelectronic devices, or smaller arrays of optoelectronic devices, the yield from a semiconductor wafer is greatly improved. When the optoelectronic device is a vertical cavity surface emitting laser (VCSEL), an increase in the VCSEL yield significantly reduces the production cost of a parallel transceiver that uses a constructed array. The challenge of aligning the optical emitters of the individual dies that together form the constructed array is met after die attaching the individual dies to a shim.

The shim includes a first mounting region and tabs that extend from the first mounting region. The first mounting region overlaps a portion of the surface of a first lead frame. The first mounting region of the shim is fixed to the first lead frame by two or more mechanical connections (e.g., welds). Each tab includes a second mounting region or plate for attaching a die along a first surface and later attaching the shim to a second lead frame along a second surface opposed to the first surface. Each tab also includes a bridge region which connects the first mounting region to the second mounting region. The bridge region traverses a channel between the first and the second lead frames.

A "laser hammering" technique is selectively used along an axis on the bridge region of a tab to adjust the relative position of a die attached to the respective second mounting region. When laser generated energy strikes the surface of the bridge, it heats a local area much faster than the surrounding area can absorb the heat energy. A localized area transitions into a liquid, while the surrounding area remains a solid. After the laser energy is removed, the localized area cools and transitions back into a solid. As the material continues to cool to ambient temperature, it continues to contract in accordance with a coefficient of thermal expansion. The contraction slightly moves the surrounding material towards the localized area. The application and removal of laser energy in a controlled manner along a desired axis in the bridge region of the tab is used to adjust the position of the attached die by drawing the solid surrounding material in a direction substantially orthogonal to the axis of the applied laser energy. To prevent warping, laser energy can be directed at a localized area from both above and below the bridge surfaces in a channel formed between the first lead frame and the second lead frame.

Figure 1:
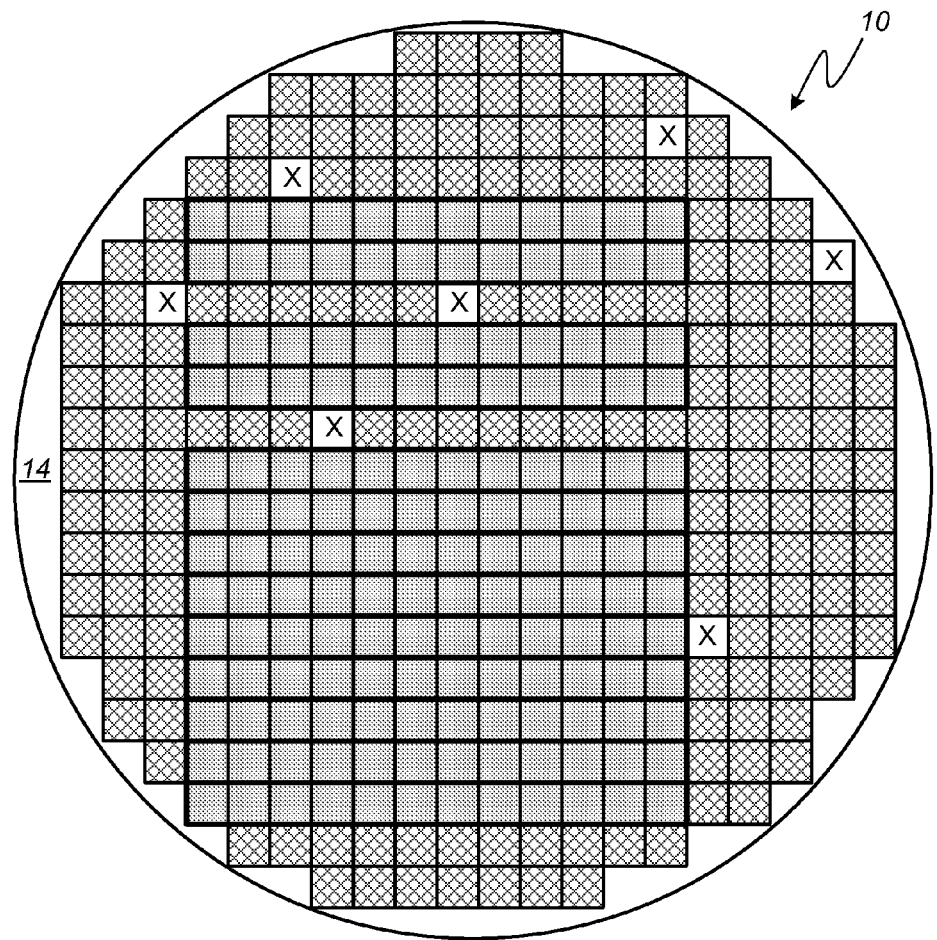
FIG. 1 is a schematic diagram illustrating how linear arrays are selected from a semiconductor wafer.
Figure 2:
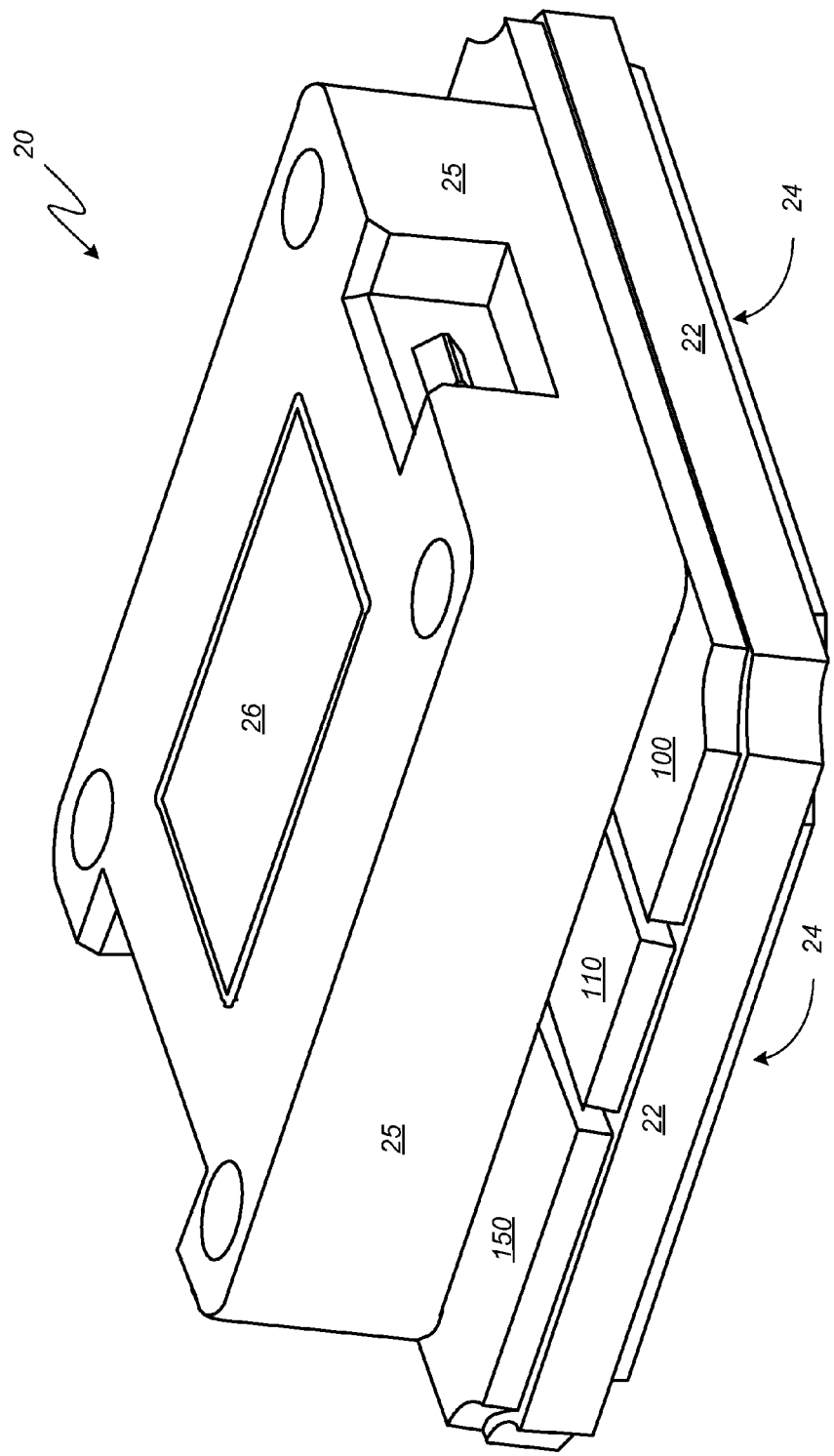
FIG. 2 is a perspective view of an embodiment of an optoelectronic assembly.

Turning now to the remaining drawings, reference is made to FIG. 2, which illustrates a perspective view of an example embodiment of an optoelectronic assembly 20. The optoelectronic assembly 20 includes a lead frame 100, a lead frame 110, and a lead frame 150 arranged on a surface of a printed circuit board 22. An opposed surface of the printed circuit board 22 is electrically connected to a land grid array 24, which includes internal conductors for electrically coupling circuits in the printed circuit board 22 to a motherboard (not shown). A frame 25 is secured to the lead frame 100, the lead frame 110, and the lead frame 150. The frame 25 is also secured to an optical sub-assembly 26, which is in registration above a constructed array of VCSELs (obstructed from view in FIG. 2) and a fixed array of photo diodes (also obstructed from view in FIG. 2) arranged along an upper surface of lead frame 110. The frame 25 includes features on opposing surfaces to optically and physically couple a connector (not shown) with multiple light transmitting fibers to the optoelectronic assembly 20.

FIG. 3 is a perspective view illustrating the optoelectronic assembly 20 of FIG. 2 with the frame 25 and optical sub-assembly 26 removed. The perspective view of FIG. 3 includes a partial section of a transmitter driver IC 140 and a partial section of a receiver IC 180. The transmitter driver IC 140 is fixed on a surface of the lead frame 100. The receiver IC 180 is fixed on a surface of the lead frame 150. A fixed array 170 and a constructed array 160 are above the lead frame 110. The fixed array 170 includes a select number of photosensitive semiconductor devices. The fixed array 170 is fixed to a surface of the lead frame 110. The partial section of the transmitter driver IC 140 reveals a portion of a shim 120.

The shim 120 is welded or otherwise fixed to the lead frame 100 over a first mounting region and includes N tabs. The tabs each include a bridge region and a second mounting region. The N tabs extend from the first mounting region beyond the edge of the lead frame 100. The bridge traverses a channel between the lead frame 100 and the lead frame 110. The second mounting region includes a first surface for fixedly attaching a die having M optoelectronic devices and a second surface. The second surface is fixed to a surface of the lead frame 110. The constructed array 160, which includes N separate dies of M optoelectronic devices, where N and M are integers, is aligned by laser hammering the shim 120 in one or more bridge regions. The aligned array forms a 1×(N*M) array of optoelectronic devices.

The transmitter driver IC 140 is electrically connected to the constructed and aligned array 160 by a set of wire bonds (not shown). The transmitter driver IC 140 includes circuits for providing the data and control signals necessary to enable VCSELs in the constructed array 160 to transmit optical signals responsive to the data signals. The transmitter driver IC 140 is electrically connected to the printed circuit board 22 by one or more sets of bond wires (not shown). The receiver IC 180 is electrically connected to the fixed array 170 by a set of bond wires (not shown). The fixed array 170 may include a desired number of photo diodes for converting received optical signals into electrical signals. The receiver IC 180 is electrically connected to the printed circuit board 22 by one or more sets of bond wires (not shown). The gaps or channels between the lead frame 100, the lead frame 110 and the lead frame 150 thermally isolate the constructed array 160 of VCSELs from the transmitter driver IC 140 and the fixed array 170 of photo diodes from the receiver IC 180.

In the example embodiment, the constructed array 160 includes six die with each die including a 1×2 array of VCSELs to enable twelve total transmit channels and the fixed array 170 includes an array of twelve photo diodes to support twelve total receive channels. In accordance with this embodiment, a parallel optical transceiver constructed with the optoelectronic assembly 20' will support twelve transmit channels and twelve receive channels.

Figure 4A:
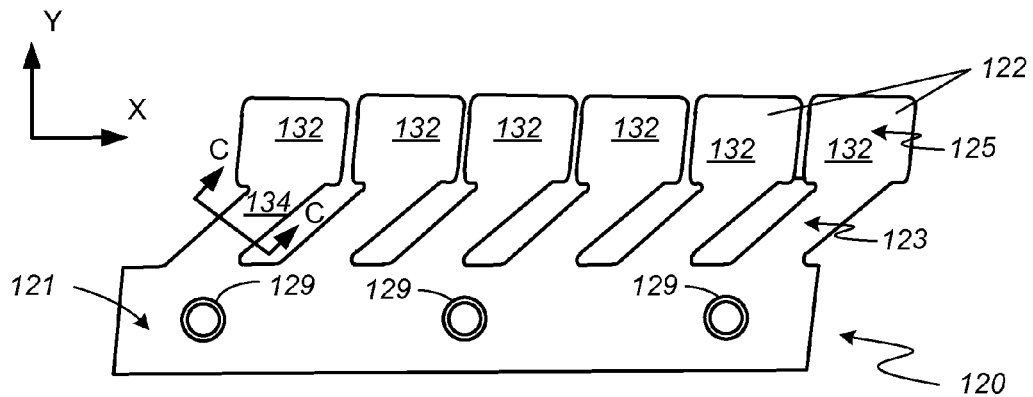
FIGS. 4A-4D include schematic diagrams illustrating an embodiment of the shim of FIG. 3 and a laser hammering operation in a bridge region of the same that adjusts the position of a mounting surface of the shim.

FIG. 4A includes an example embodiment of the shim 120 of FIG. 3. The shim 120 includes a first mounting region 121 and N tabs 122. The first mounting region 121 includes welds 129, which fixedly attach the shim 120 to the lead frame 100 (not shown). Each of the tabs 122 includes a second mounting region 125 and a bridge region 123. The second mounting region 125 includes a surface for attaching a die (i.e., the viewable surface) and an opposed surface for later attaching the shim 120 to lead frame 110. The bridge region 123 connects the first mounting region 121 to each of the corresponding second mounting regions 125 of each tab 122. As shown in FIG. 4A, the bridge region 123 extends from the first mounting region 121 in both a first direction defined by an X-axis and a second direction defined by a Y-axis. Each of the respective bridge regions 123 is substantially parallel to the remaining bridge regions 123 of the tabs 122. The example embodiment includes a shim 120 with six tabs. However, it should be understood that the shim 120 is not so limited and may include any desired number of tabs 122 suitable for supporting a constructed array of a desired number of die.

Figure 4B:
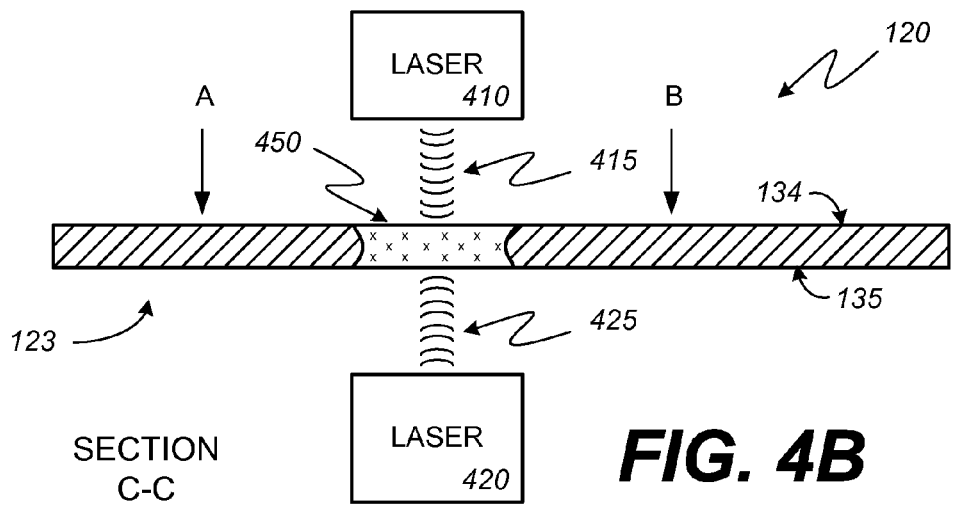
Figure 4C:
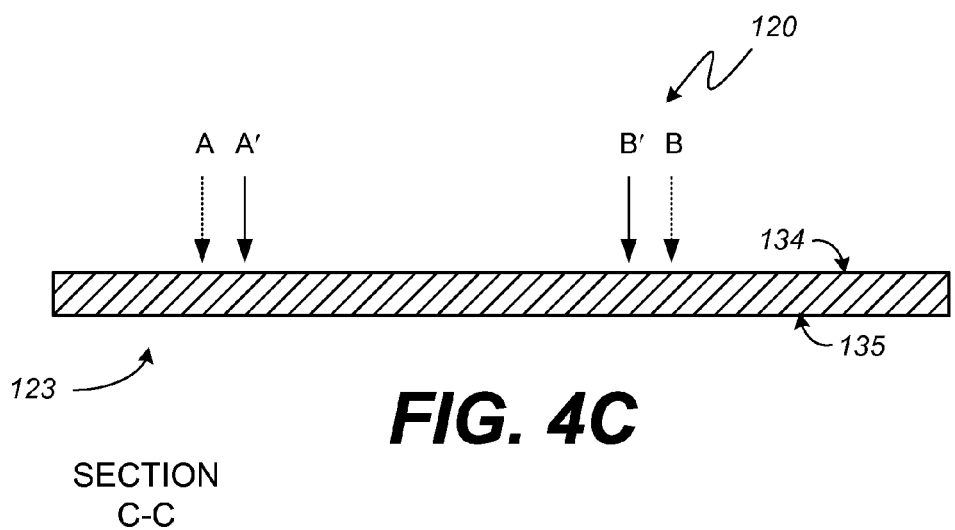

The use of laser energy in a laser hammering technique to adjust the position of the second mounting portion 125 in the X-Y plane (by reshaping the bridge region 123 of the shim 120) is illustrated and described in association with FIGS. 4B and 4C. FIG. 4B includes a cross-sectional view of the bridge portion 123 of the tab 122 in the direction of line C-C (see FIG. 4A). A first laser 410 directs energy in a beam 415 at a select localized area of the surface 134. Substantially simultaneously, a second laser 420 directs energy in a beam 425 at a select localized area of the surface 135. As described briefly above, the laser energy heats the metal or alloy in a select region closest to the localized or targeted areas more quickly than the surrounding material can absorb and dissipate the heat. Consequently, once the temperature of the targeted area meets or exceeds the melting point of the material of the shim 120, the material melts or liquefies in the localized area 450. A reference point indicated by the arrow labeled A and a reference point indicated by the arrow labeled B are introduced to show the position of the respective points at a time when the laser 410 and the laser 420 have liquefied the material in the localized area 450.

FIG. 4C includes a cross-sectional view of the bridge region 123 of the tab 122 in the direction of line C-C after the laser energy has been removed and the bridge region 123 of the tab 122 has returned to ambient temperature. As shown in FIG. 4C the material has solidified and the respective reference points A and B have shifted to reference point A' and B'. That is, the material surrounding the localized area has contracted and moved toward the localized area that was laser hammered.

Figure 4D:
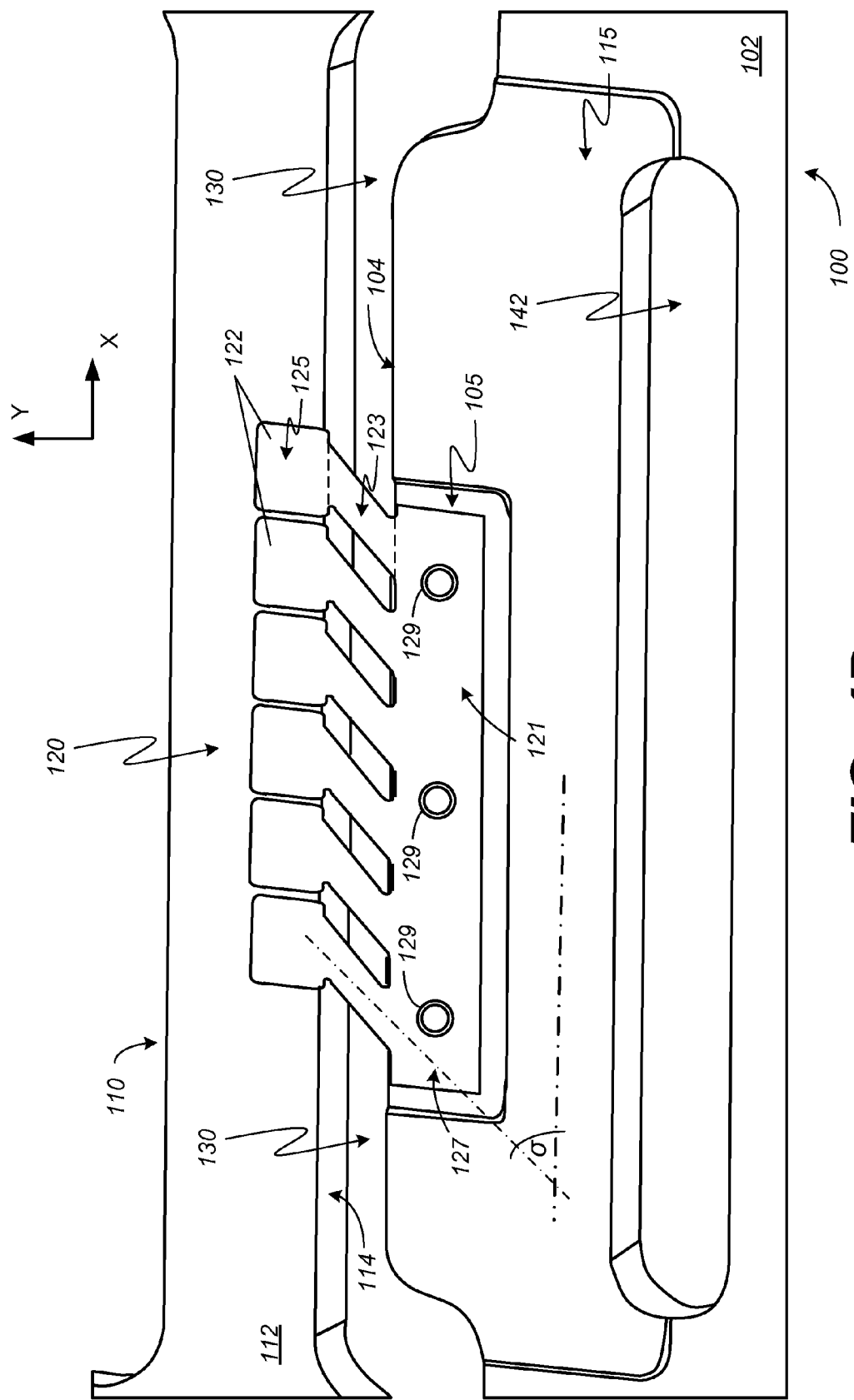

FIG. 4D is a schematic diagram illustrating the shim 120 in arrangement with the lead frame 100 and the lead frame 110. As illustrated in FIG. 4D, the lead frame 100 has an edge 104 and a surface 102. A recess 115 is stamped or otherwise formed in the surface 102. A recess 105 is stamped or otherwise formed in a portion of the recess 115 along a central portion of the edge 104 adjacent to the lead frame 110. The recess 115 is shaped to receive a driver integrated circuit (not shown) that will be placed above the shim 120. The recess 105 provides the necessary clearance that enables the lower surface of the case of the driver integrated circuit to lie against the lead frame in the recess 115. The lead frame 100 also includes a slot 142 for wire bonding conductors of a printed circuit board (not shown) to conductors of the driver integrated circuit in a subsequent manufacturing step.

The lead frame 110 has an edge 114 and a surface 112. The edge 114 of the lead frame 110 and the opposing edge 104 of the lead frame 100 form a channel 130. The channel 130 provides access to conductors on a printed circuit board. The channel 130 also provides access to laser beam 415 and laser beam 425.

The shim 120 includes a first mounting region 121 and tabs 122, which extend from the first mounting region 121. The shim 120 can be stamped, cut or milled from a sheet of metal or an alloy such as steel. The first mounting region 121 lies along the surface of the lead frame 100 in the recess 105 and is attached to the lead frame 100 at multiple locations. In the illustrated embodiment, the first mounting region 121 is attached to the lead frame 100 by way of plug welds 129. In alternative embodiments, the shim 120 can be attached to the lead frame 100 by spot welds, edge welds, and/or rivets.

Each of the tabs 122 includes a second mounting region 125 and a bridge region 123. The second mounting region 125 includes a surface for attaching a die and an opposed surface for later attaching the shim 120 to the lead frame 110. The second mounting region 125 and the bridge region 123 are substantially coplanar with the upper surface 112 of the lead frame 110 and substantially parallel to the surface 102 of the lead frame 100. The bridge region 123 connects the first mounting region 121 to each of the corresponding second mounting regions 125 of each tab 122 and traverses the channel 130 between the lead frame 100 and the lead frame 110. As shown in FIG. 4D, the bridge region 123 extends from the first mounting region 121 in both a first direction defined by an X-axis and a second direction defined by a Y-axis. Each of the respective bridge regions 123 is substantially parallel to the remaining bridge regions 123 of the tabs 122. A longitudinal axis 127 of an example bridge region 123 forms an angle, σ, with respect to a line that is parallel to the edge 104.

Figure 5:
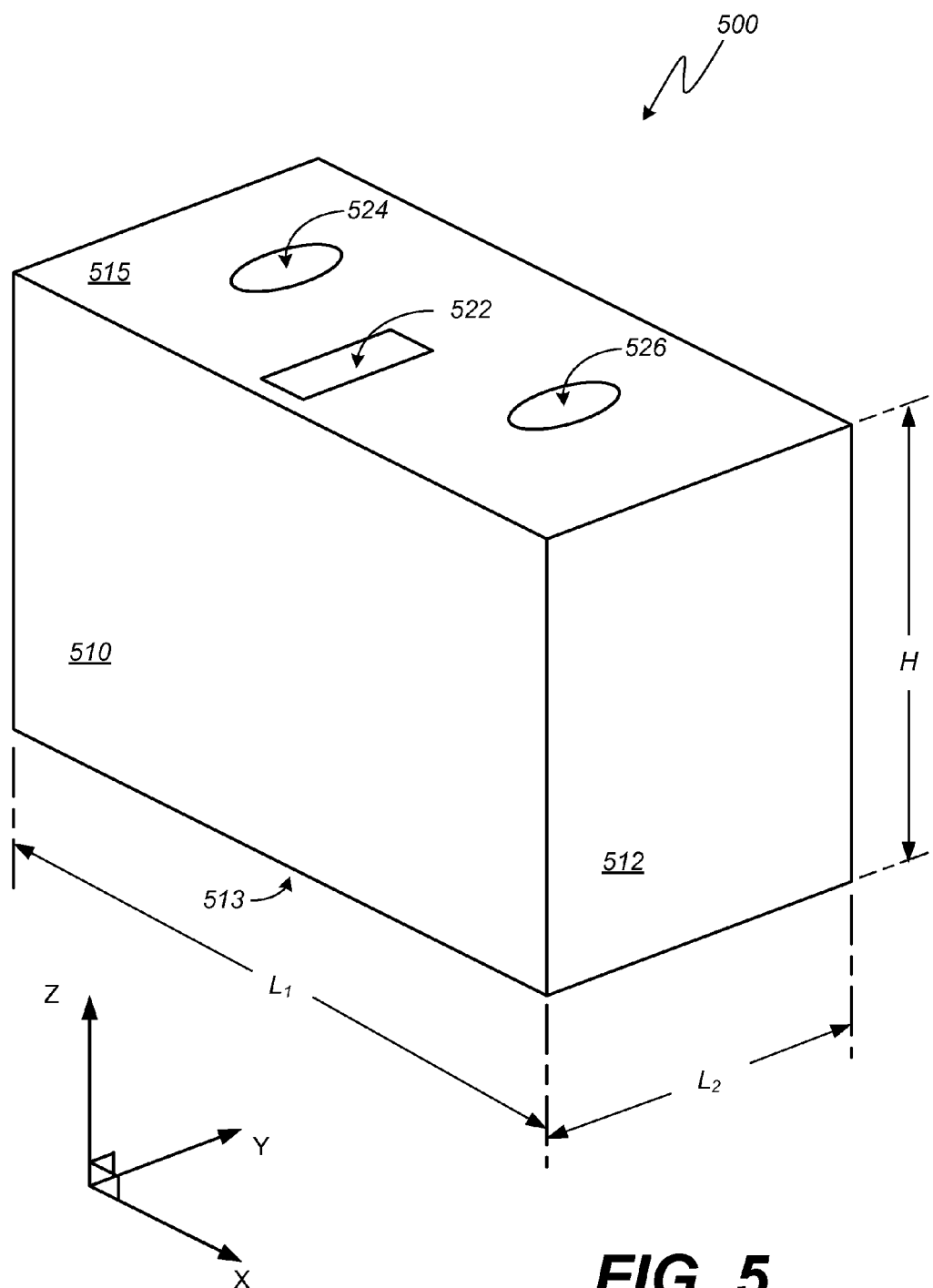
FIG. 5 is a schematic diagram illustrating an embodiment of a die.

FIG. 5 is a schematic diagram illustrating an embodiment of an example die 500. The die 500 is diced or otherwise separated from a wafer of semiconductor material. The die 500 includes a VCSEL 524 and a VCSEL 526 that share a common connection 522. In operation, the VCSEL 524 and the VCSEL 526 emit light from the surface 515. In the illustrated embodiment, the die 500 forms a 1×2 array or a one-dimensional array with two devices. The VCSEL 524 and the VCSEL 526 are separated by a distance that is determined as a result of the techniques used to manufacture semiconductor devices along the active surface of a semiconductor wafer. The die 500 is not limited to two devices and in alternative embodiments any integer number of devices may be included on a die.

However arranged, the die 500 will include an electrical contact for applying a signal to each respective VCSEL on the die and at least one common or electrical ground connection 522 to electrically couple the die 500 to external electronic devices. The die 500 includes a first diced surface 510 and a second diced surface 512. The first diced surface 510 is formed by a tool that precisely cuts, saws or otherwise machines a semiconductor wafer along a first direction or axis. The second diced surface 512 is formed by a tool that precisely cuts, saws or otherwise machines the semiconductor wafer along a second direction or axis. The first direction or axis is substantially orthogonal to the second direction. The first diced surface 510 has a length, $L_1$, along the first direction. The second diced surface 512 has a length, $L_2$, along the second direction. As indicated in FIG. 5, $L_1$ is greater (i.e., longer) than $L_2$. The die 500 is further characterized by a height, H, which is determined by the thickness of the semiconductor wafer from which the die 500 is removed after any polishing and or grinding of the non-active surface 513. The non-active surface 513 provides a base for attaching the die 500 to a respective second mounting region 125 of a tab 122 on the shim 120.

Figure 6A:
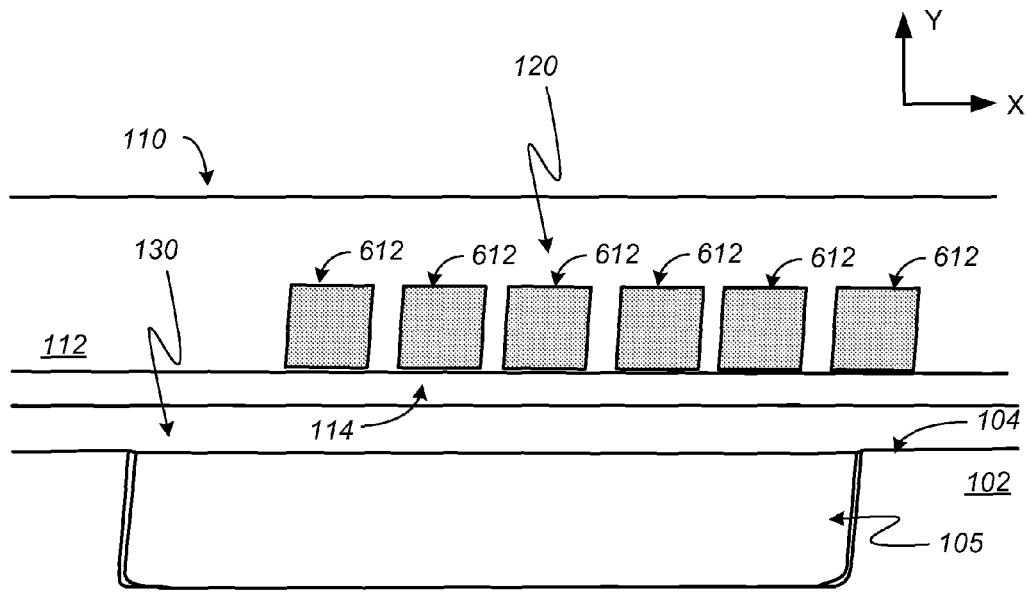
FIGS. 6A-6E include schematic diagrams illustrating a method for manufacturing a constructed and aligned array of optoelectronic devices using the shim of FIG. 3 and the laser hammering technique of FIGS. 4B and 4C.
Figure 6B:
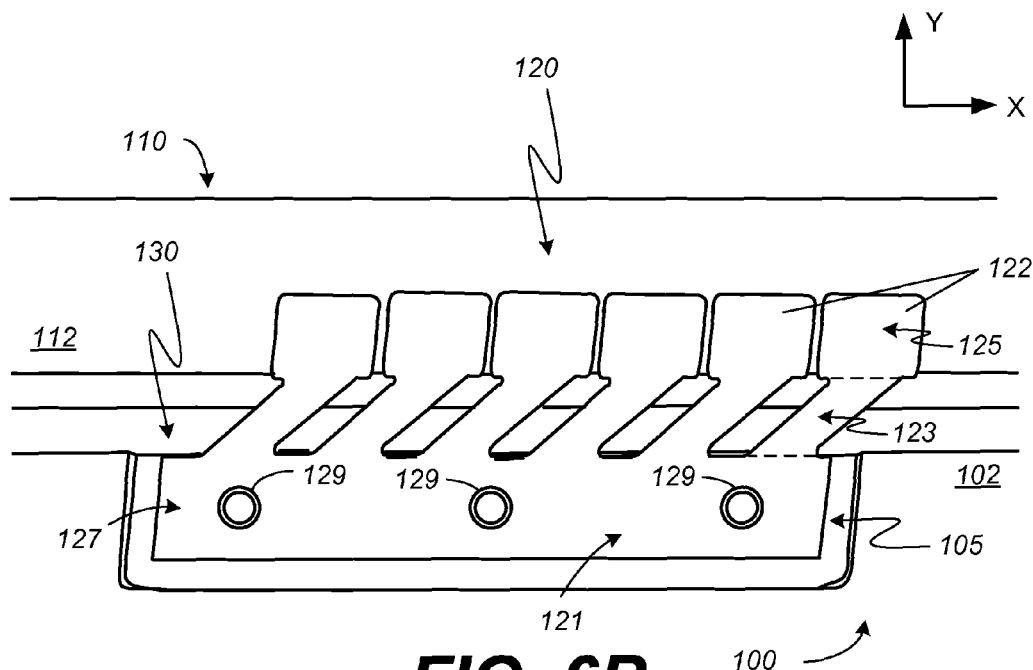
Figure 6C:
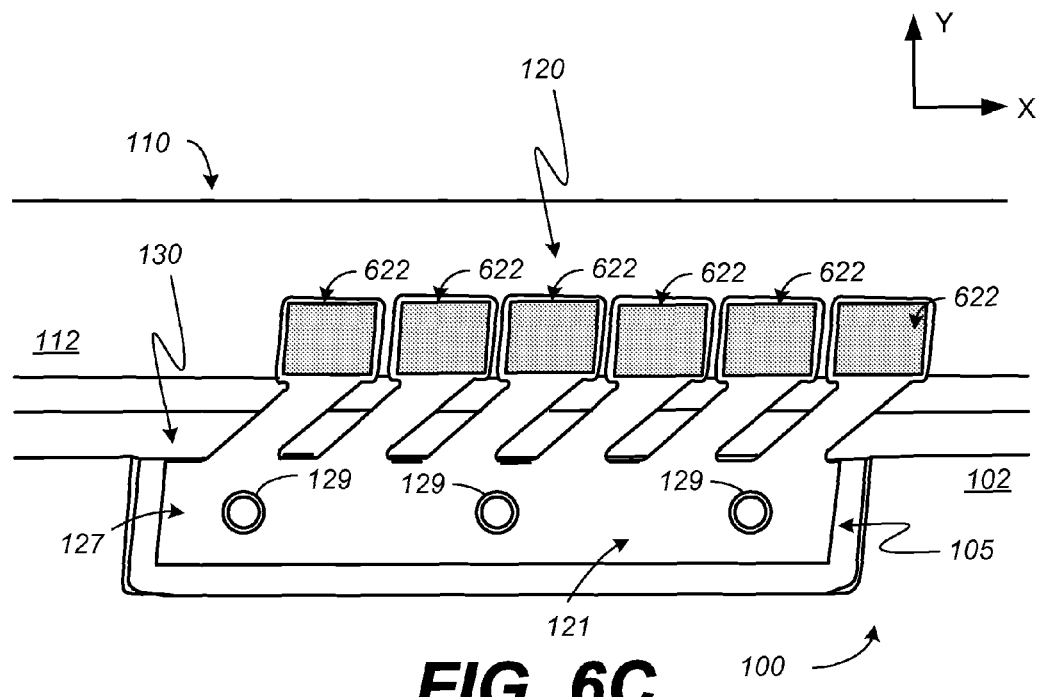

FIGS. 6A-6E include schematic diagrams illustrating a method for manufacturing a constructed and aligned array of optoelectronic devices using the shim of FIG. 3 and the laser hammering technique of FIG. 4B. In FIG. 6A a layer of epoxy 612 is applied along the surface 112 of the second lead frame 110. The epoxy can be applied across N separate target zones, as shown in the illustrated example, or in one or more sub-target zones. In FIG. 6B, the shim 120 and the attached lead frame 100 are placed in registration with the lead frame 100 such that the respective second mounting regions 125 of the tabs 122 contact the epoxy 612. That is, the respective surfaces 135 of the second mounting regions 125 contact the epoxy 612. The epoxy 612 will remain uncured until after the constructed array 160 (FIG. 3) is aligned. In FIG. 6C, a layer of epoxy 622 is applied to the respective surface 132 of each of the second mounting regions 125 in preparation for attaching the respective die 500.

Figure 6D:
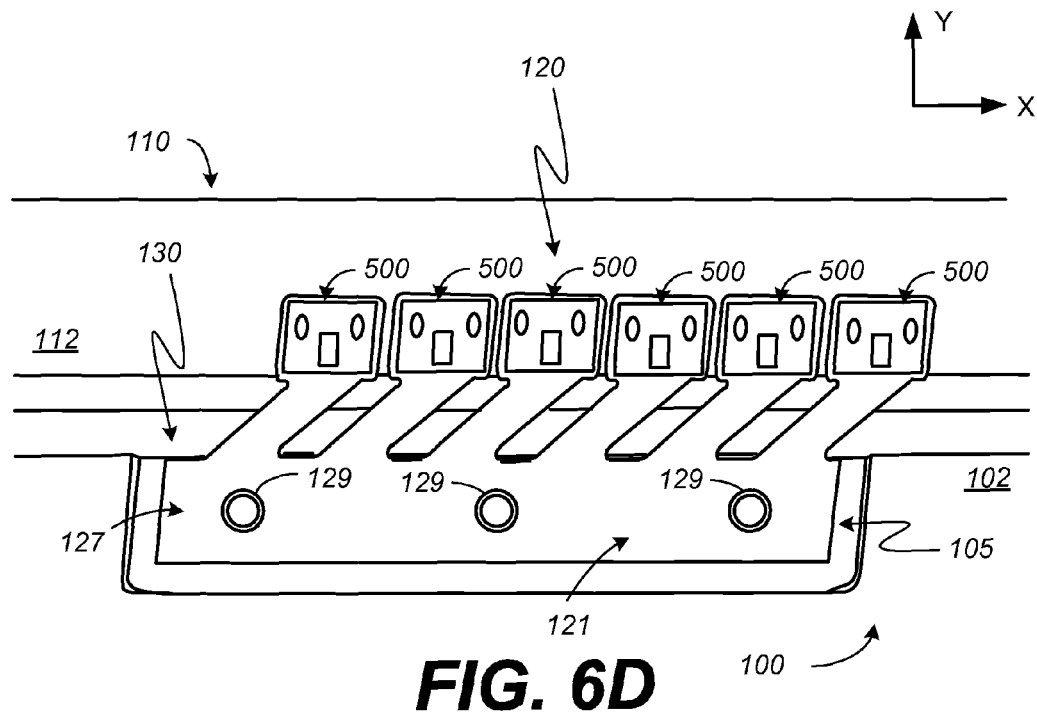

In FIG. 6D, a die 500 is attached to the surface 132 of the second mounting region 125 of each of the respective tabs 122. Preferably, each die is attached to the corresponding second mounting region 125 within one die attach tolerance distance in a positive X and positive Y direction as indicated by arrow 650 in FIG. 6E. The die may be intentionally offset in this direction because the laser hammering operation can only move the attached die in directions permitted by contraction of the shim material in the bridge region 123. The attachment can be made by adding a layer of epoxy to the surface 513, the surface 132, or both surfaces and bringing the respective die 500 in registration with the second mounting regions 125 of the shim 120. The epoxy 622 can be cured to attach the respective die 500 to the tabs 122. When the die 500 is attached to the surface 132, it is desired that the respective VCSELS on the adjacent die maintain the same separation distance established by the VCSELS in the 1×2 array or are arranged within a desired tolerance to match features of an optical sub-assembly 26 (FIG. 2).

Figure 6E:
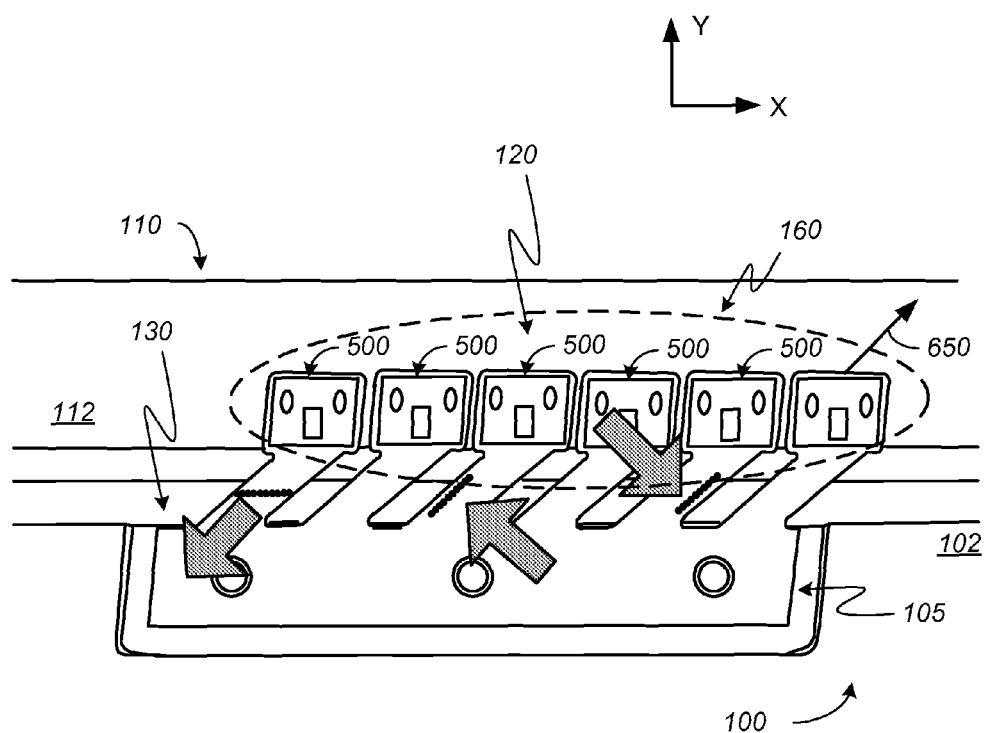

In FIG. 6E, a laser hammering technique is performed on select bridge regions of the shim 120. In the illustration, the odd numbered bridge regions moving from left to right across the illustration are manipulated by a laser hammering technique. In the first or leftmost bridge region, a laser hammering across multiple targeted areas arranged across the bridge region draws the corresponding second mounting region and the die 500 attached thereto in the negative X and negative Y direction or along the longitudinal axis of the bridge region. In the third bridge region, a laser hammering across multiple targeted areas arranged along an axis that is substantially parallel to the longitudinal axis of the bridge region and closer to the left edge of the bridge region draws the corresponding second mounting region and the die 500 attached thereto in the negative X and positive Y direction or along a direction that is substantially orthogonal to the axis. In the fifth or rightmost adjusted bridge region, a laser hammering across multiple targeted areas arranged along an axis that is substantially parallel to the longitudinal axis of the bridge region and closer to the right edge of the bridge region draws the corresponding second mounting region and the die 500 attached thereto in the positive X and negative Y direction or along a direction that is substantially orthogonal to the axis.

In the illustrated example, the constructed and aligned array 160 is formed by aligning the six die (when required) such that any variation across the VCSELs in the Y direction is within a desired tolerance and such that the spatial separation between each adjacent VCSEL in the array is consistent within a desired tolerance. These desired tolerances are determined by the required optical alignment for optically coupling the emitted light from each of the VCSELs to a corresponding optical feature in an optical assembly that is later coupled to the constructed and aligned array 160.

Figure 7A:
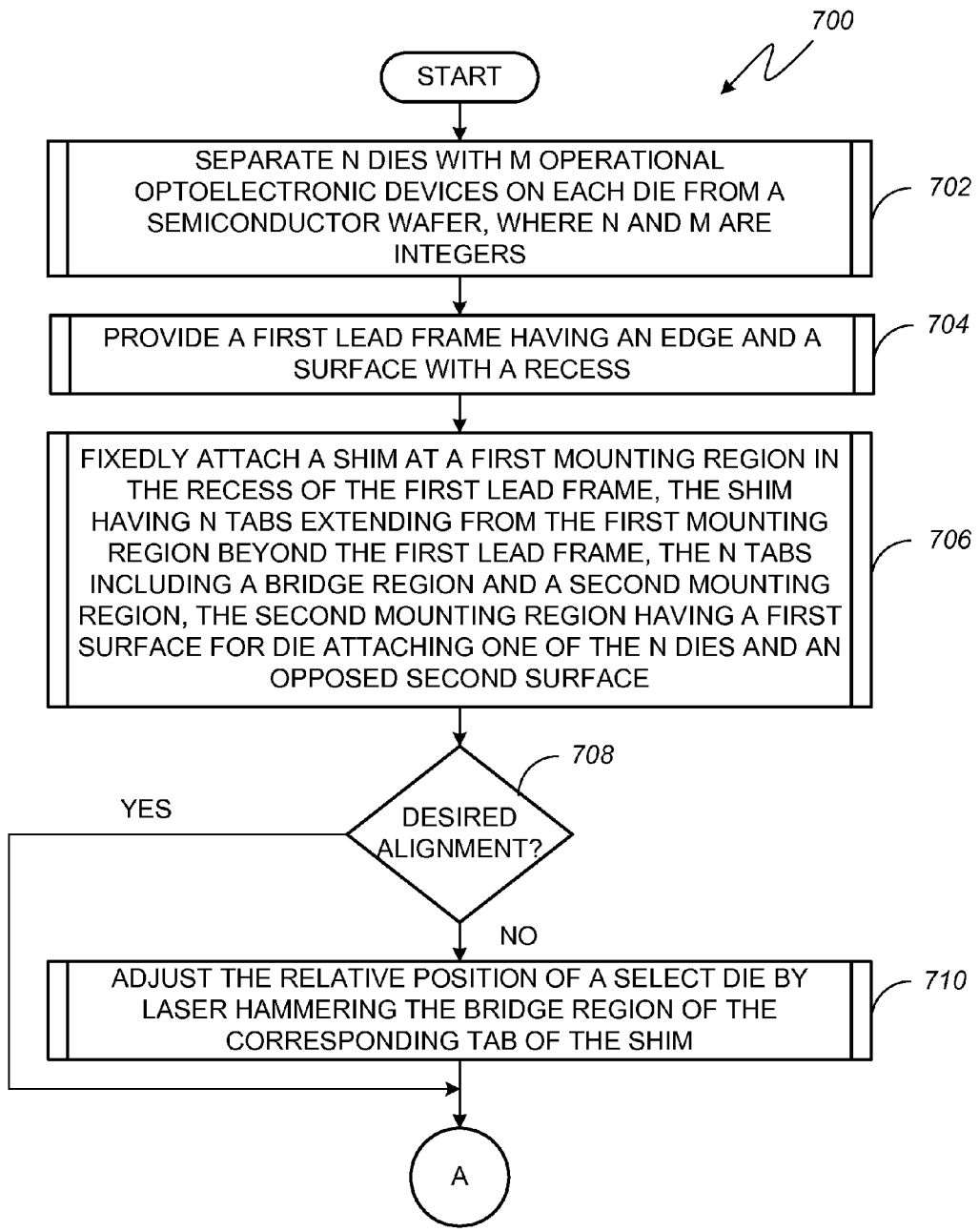
FIG. 7A is a flow diagram illustrating an embodiment of a method for manufacturing a constructed array of optical devices.

FIG. 7A is a flow diagram illustrating an embodiment of a method 700 for manufacturing a constructed array of optical devices. The method 700 begins with block 702, where N dies 500 each having M operational optoelectronic devices (e.g., VCSEL 524 and VCSEL 526 are separated from a semiconductor wafer. As further indicated in block 702, N (the number of dies) and M (the number of devices on each die) are integers. In block 704, a first lead frame 100 is provided. The lead frame 100 has an edge 104 and a surface 102 with at least one recess 105. In block 706, a shim 120 is attached at a first mounting region 121 in the recess 105 of the lead frame 100. As further indicated in block 706, the shim 120 has N tabs 122 extending from the first mounting region 121 beyond the edge 104 of the lead frame 100. The N tabs 122 include a bridge region 123 and a second mounting region 125. The second mounting region 125 includes a surface for attaching a respective die 500 and an opposed surface.

Figure 7B:
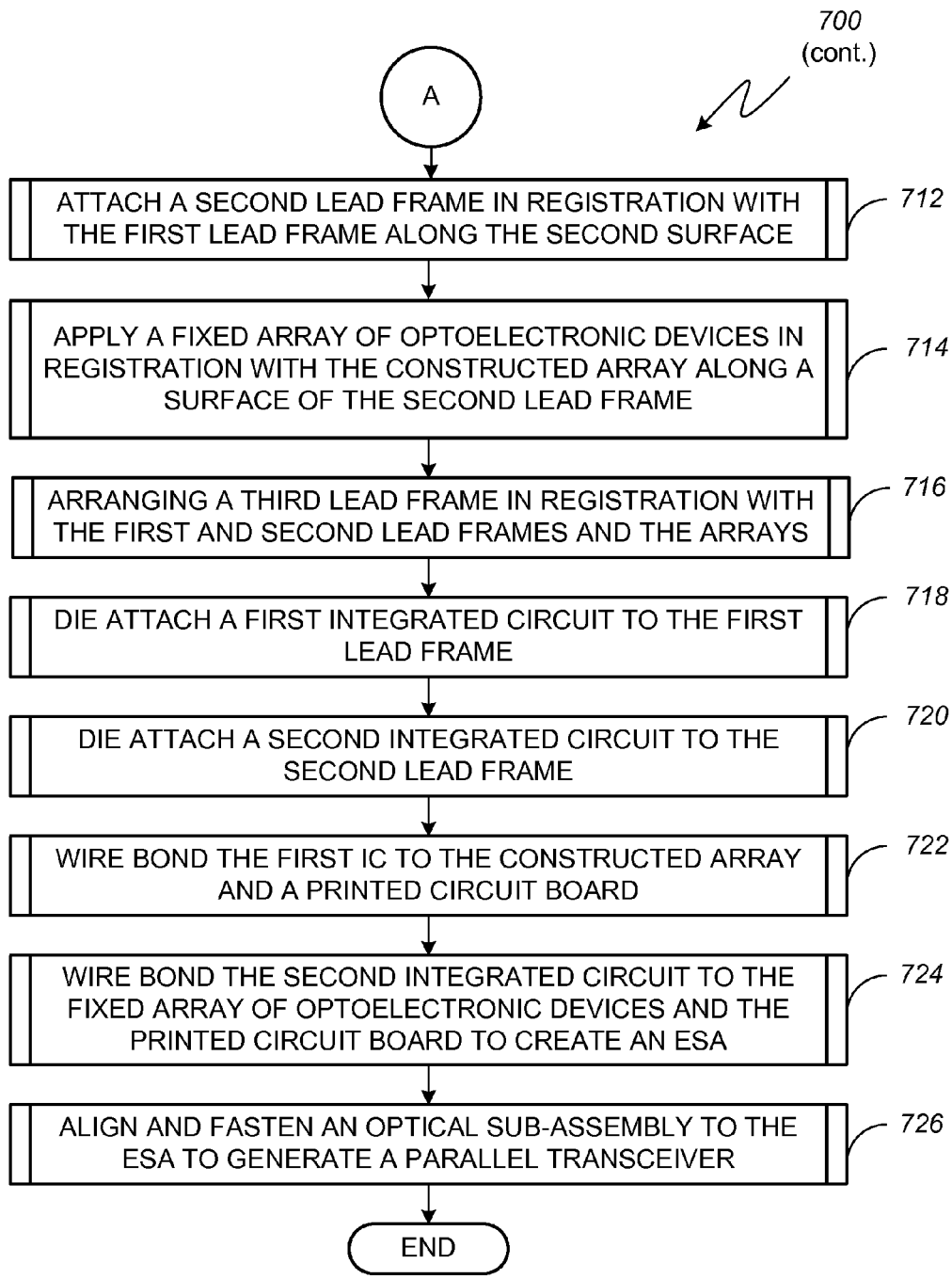
FIG. 7B is a flow diagram illustrating an embodiment of a method for manufacturing a parallel transceiver using the constructed array of optical devices of FIG. 3.

After each of the N dies are attached to the respective second mounting regions, the alignment of a respective feature (or features) of each of the N dies 500 attached to the shim 120 are checked for a desired alignment, as indicated in decision block 708. As described above, the desired alignment will include a first tolerance describing the permitted variation in a separation distance between the VCSELs arranged across the N dies in a first direction and a permitted variation in a second direction, orthogonal to the first direction. When the constructed array of N dies is properly aligned, as indicated by the flow control arrow labeled, "YES," the method 700 continues with block 712 (FIG. 7B). Otherwise, when the constructed array of N dies is not properly aligned, the relative position of a select die is adjusted by laser hammering the bridge region 123 of the corresponding tab 122 of the shim 120, as shown in block 710. Thereafter, a lead frame 110 is placed in registration with the combination of the lead frame 100 and the shim 120 and attached such that the second mounting region 125 of the tabs 122 substantially overlaps a surface 112 of the lead frame 110. In block 714, a fixed array of optoelectronic devices 170 is placed in registration with the constructed array 160 along a surface of the lead frame 110. In block 716, a lead frame 150 is arranged in registration with the lead frame 100, the lead frame 110 and the arrays. In block 718, a transmitter driver IC 140 is attached to the lead frame 100. In block 720, a receiver IC 180 is attached to the lead frame 150. Thereafter, as indicated in block 722, the transmitter driver IC 140 is electrically coupled to the constructed array 160 and the printed circuit board 22. In block 724, the receiver IC 180 is electrically coupled to the fixed array 170 and the printed circuit board 22. As further indicated in block 724, the land grid array 24, the printed circuit board 22, lead frames, arrays, and ICs form an electronic sub-assembly (ESA). Next, as shown in block 726, an optical sub-assembly is aligned and fastened to the ESA to complete the parallel transceiver module.

Figure 8:
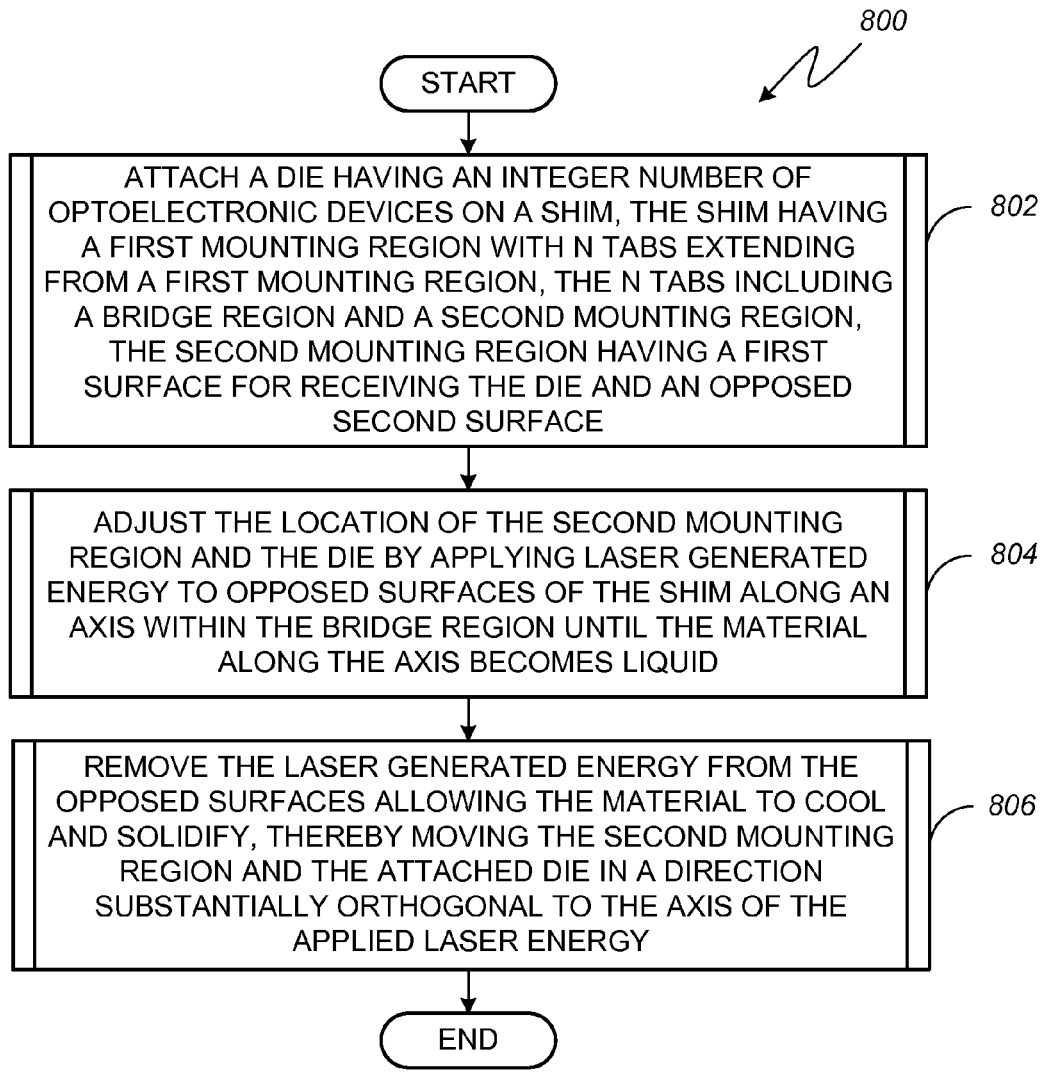
FIG. 8 is a flow diagram illustrating an embodiment of a method for adjusting the relative position of a die in a constructed array of dice.

FIG. 8 is a flow diagram illustrating an embodiment of a method 800 for adjusting the relative position of a die in a constructed array of dice. The method 800 begins with block 802 where a die 500 having an integer number of optoelectronic devices is attached to a shim 120. The shim 120 is arranged with a first mounting region 121 and N tabs 122 extending from the first mounting region 121. The N tabs 122 include respective bridge regions 123 and second mounting regions 125. As described above, the die is attached to a surface of the second mounting region 125 of one of the tabs 122. Thereafter, as indicated in block 804, the location of the second mounting region 125 and the attached die 500 is adjusted by applying laser generated energy to opposed surfaces of the shim 120 along an axis within the corresponding bridge region 123 until the material along the axis is heated to its melting temperature. As shown in block 806, the laser energy is removed, which allows the material to cool and solidify. As the previously melted material returns to ambient temperature, the surrounding material in the bridge region 123 contracts in a direction that is substantially orthogonal to the axis along which the laser energy was applied.

While various example embodiments of an optoelectronic module and methods for manufacturing an aligned array of optoelectronic devices have been described, it will be apparent to those of ordinary skill in the art that many more embodiments and implementations are possible that are within the scope of this disclosure. Accordingly, the described sub-assemblies, modules and methods for manufacturing an array of optical devices are not to be restricted or otherwise limited except in light of the attached claims and their equivalents.

What is claimed is:

1. An optoelectronic module including a constructed array of N dies with M operational optoelectronic devices, where N and M are integers, the optoelectronic module, comprising:
   a first lead frame having a first edge;
   a second lead frame having a second edge, the second lead frame adjacent to the first lead frame, the first lead frame and the second lead frame forming a channel between the first edge and the second edge, the channel permitting the application of laser generated energy from laser sources in the vicinity of the channel; and
   a shim attached to the first lead frame, the shim having a first mounting region and N tabs extending from the first mounting region beyond the edge of the first lead frame, the N tabs including a bridge region and a second mounting region, at least a portion of the bridge region traversing the channel, the second mounting region having a first surface for fixedly attaching an optoelectronic device and a second surface, wherein the constructed array is aligned by laser hammering a bridge region.

2. The optoelectronic module of claim 1, wherein the N tabs extend beyond the edge of the first lead frame in a first direction and a second direction.

3. The optoelectronic module of claim 2, wherein the first and second directions define a plane that is substantially coplanar with respective major surfaces of the first lead frame and the second lead frame.

4. The optoelectronic module of claim 3, wherein a longitudinal axis of the bridge region forms an angle with respect to the first edge.

5. The optoelectronic module of claim 1, wherein the first surface is opposed to the second surface.

6. The optoelectronic module of claim 1, wherein the first lead frame includes a first recess shaped to receive the first mounting region.

7. The optoelectronic module of claim 1, wherein each optoelectronic device comprises an integer number of vertical cavity surface emitting lasers.

8. The optoelectronic module of claim 7, wherein the vertical cavity surface emitting lasers are arranged in a one-dimensional array.

9. The optoelectronic module of claim 1, wherein laser hammering comprises directing laser energy from opposing directions through the channel.

10. The optoelectronic module of claim 1, wherein the second surface of the second mounting region is coupled to the second lead frame with an epoxy layer that remains uncured until after laser hammering is complete and any shim material flow in the bridge region has returned to a solid at approximately ambient temperature.

11. The optoelectronic module of claim 1, wherein alignment of each of the respective optoelectronic devices forming the constructed array is verified and the epoxy layer along the second surface of the shim and a surface of the second lead frame is cured.

12. The optoelectronic module of claim 1, wherein the channel thermally isolates the constructed array from a transmitter driver.

13. The optoelectronic module of claim 1, further comprising:
   a third lead frame adjacent to the first lead frame, wherein a channel between the first lead frame and the third lead frame thermally isolates a fixed array from a receiver circuit.

14. The optoelectronic module of claim 1, wherein the shim is stamped, cut or milled from a sheet.

15. The optoelectronic module of claim 1, wherein the shim is made from an alloy.

16. The optoelectronic module of claim 1, wherein the shim is attached to the first lead frame with a weld.

17. The optoelectronic module of claim 16, wherein the weld is selected from the group consisting of spot, edge, and plug.

18. The optoelectronic module of claim 6, wherein the first recess is in a portion of a larger recess arranged in the first lead frame.

19. The optoelectronic module of claim 18, wherein the larger recess enables a driver integrated circuit to lie against the first lead frame.

20. The optoelectronic module of claim 19, wherein the first lead frame includes a slot that provides access to wire bonds that couple the driver integrated circuit to a printed circuit board.

* * * * *